United States Patent
Sudani et al.

(10) Patent No.: US 12,336,297 B2
(45) Date of Patent: Jun. 17, 2025

(54) ULTRA-LOW LEAKAGE DIODES USED FOR LOW INPUT BIAS CURRENT

(71) Applicant: TEXAS INSTRUMENTS INCORPORATED, Dallas, TX (US)

(72) Inventors: Siva Kumar Sudani, Tucson, AZ (US); Jerry L. Doorenbos, Tucson, AZ (US); YuGuo Wang, Dallas, TX (US); Srinivas Kumar Pulijala, Tucson, AZ (US); Bharath Karthik Vasan, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 575 days.

(21) Appl. No.: 17/681,664

(22) Filed: Feb. 25, 2022

(65) Prior Publication Data

US 2023/0275082 A1 Aug. 31, 2023

(51) Int. Cl.
H10D 89/60 (2025.01)
H02H 9/04 (2006.01)
H03F 1/52 (2006.01)

(52) U.S. Cl.
CPC .......... *H10D 89/611* (2025.01); *H02H 9/046* (2013.01); *H03F 1/52* (2013.01); *H10D 89/921* (2025.01); *H03F 2200/426* (2013.01)

(58) Field of Classification Search
CPC . H01L 27/0255; H01L 27/0292; H02H 9/046; H03F 1/52; H03F 2200/426
USPC ...................................................... 330/298
See application file for complete search history.

(56) References Cited

U.S. PATENT DOCUMENTS

| | | | |
|---|---|---|---|
| 5,134,537 A | 7/1992 | Buss et al. | |
| 6,329,694 B1 * | 12/2001 | Lee ..................... | H01L 27/0266 257/362 |
| 7,696,580 B2 * | 4/2010 | Chen ................... | H01L 27/0255 257/370 |
| 8,035,190 B2 * | 10/2011 | Liu ..................... | H01L 29/7378 438/432 |

(Continued)

FOREIGN PATENT DOCUMENTS

| | | | | |
|---|---|---|---|---|
| CN | 209357727 U | * | 9/2019 | ......... H01L 27/0255 |
| EP | 4254499 A1 | * | 10/2023 | ......... H01L 27/0255 |
| WO | 2007013145 A1 | | 2/2007 | |

OTHER PUBLICATIONS

Chun-Yu Lin, Low-C ESD Protection Design in CMOS Technology, published by Intech Open, 2019 (Year: 2019).*

(Continued)

*Primary Examiner* — Hafizur Rahman
(74) *Attorney, Agent, or Firm* — John R. Pessetto; Frank D. Cimino

(57) ABSTRACT

In an example, a device includes a semiconductor substrate having a top surface. The device also includes a P-doped well formed in the semiconductor substrate and extending downwardly from the top surface. The device includes a cathode of a diode formed by an N-doped region in the P-doped well. The device also includes an anode of the diode formed by a P-doped region, the P-doped region spaced away from the N-doped region in the P-doped well. The device includes a deep N-type buried layer (DNBL) formed in the semiconductor substrate, the P-doped well formed between the top surface and the DNBL. The device also includes an N-doped well extending from the top surface to the DNBL.

18 Claims, 7 Drawing Sheets

(56) References Cited

U.S. PATENT DOCUMENTS

| | | | |
|---|---|---|---|
| 9,768,340 B2 | 9/2017 | Basu et al. | |
| 2006/0043489 A1 | 3/2006 | Chen et al. | |
| 2007/0241421 A1* | 10/2007 | Liu | H01L 27/0921 |
| | | | 257/E21.375 |
| 2015/0002967 A1* | 1/2015 | Kawase | H01L 27/0255 |
| | | | 257/132 |
| 2015/0077888 A1* | 3/2015 | Galy | H01L 29/7436 |
| | | | 361/56 |
| 2020/0059092 A1 | 2/2020 | Lee et al. | |

OTHER PUBLICATIONS

Eugene Palatnik ("High-impedance buffer amplifier's input includes ESD protection" published in EDN on Aug. 7, 2019 (Year: 2019).*

Pochet et al., Ultra-low Leakage ESD Protection Achieving 10.5 fA Leakage, 2021 IEEE International Symposium on Circuits and Systems (ISCAS), 2021) (Year: 2021).*

Paul Blanchard and Brian Pelletier, Analog Devices, "Using ESD Diodes as Voltage Clamps", AD8221, AD8226, AD8250, AD8417, AD8418, AD8479, May 2, 2017 (Year: 2017).*

International Search Report in corresponding PCT Patent Application No. PCT/2023/013789, mailed Jun. 21, 2023.

Machine Translation for WO2007013145A1.

* cited by examiner

ULTRA-LOW LEAKAGE DIODES USED FOR LOW INPUT BIAS CURRENT

BACKGROUND

A transimpedance amplifier is a current-to-voltage converter that is often implemented with one or more operational amplifiers (op-amps). The op-amp may have diodes coupled to the input terminals, to provide input gate protection and electrostatic discharge (ESD) protection for the op-amp. For precise operation, the op-amp in the transimpedance amplifier should have low bias currents ($I_B$) at the op-amp input terminals. The $I_B$ is mainly provided by the diodes connected to the input terminals. Low $I_B$ is useful in other applications such as gas chromatography and pH probe amplifiers.

SUMMARY

In accordance with at least one example of the description, a device includes a semiconductor substrate having a top surface. The device also includes a P-doped well formed in the semiconductor substrate and extending downwardly from the top surface. The device includes a cathode of a diode formed by an N-doped region in the P-doped well. The device also includes an anode of the diode formed by a P-doped region, the P-doped region spaced away from the N-doped region in the P-doped well. The device includes a deep N-type buried layer (DNBL) formed in the semiconductor substrate, the P-doped well formed between the top surface and the DNBL. The device also includes an N-doped well extending from the top surface to the DNBL.

In accordance with at least one example of the description, a device includes a semiconductor substrate having a top surface. The device also includes an N-doped well formed in the semiconductor substrate and extending downwardly from the top surface. The device includes a cathode of a diode formed by an N-doped region in the N-doped well. The device also includes an anode of the diode formed by a P-doped region in the N-doped well, the P-doped region spaced laterally away from the N-doped region. The device includes a deep P-type buried layer (DPBL) formed in the semiconductor substrate, the N-doped well formed between the top surface and the DPBL. The device also includes a P-doped well extending from the top surface to the DPBL.

In accordance with at least one example of the description, a circuit formed in a semiconductor substrate has a top surface, and the circuit includes an operational amplifier having an amplifier output, a first amplifier input, and a second amplifier input. The circuit includes a first diode. The first diode includes a first cathode formed by a first N-doped region at the top surface in a first P-doped well. The first diode also includes a first anode formed by a first P-doped region at the top surface in the first P-doped well, the first N-doped region spaced away from the first P-doped region. The first diode includes a DNBL, the first P-doped well situated between the top surface and the DNBL. The first diode also includes a first N-doped well extending from the top surface to the DNBL. The circuit includes a second diode. The second diode includes a second cathode formed by a second N-doped region at the top surface in a second N-doped well. The second diode also includes a second anode formed by a second P-doped region at the top surface in the second N-doped well. The second diode includes a DPBL, the second N-doped well situated between the top surface and the DPBL. The second diode also includes a second P-doped well extending from the top surface to the DPBL. The circuit includes a buffer having a buffer output, a first buffer input, and a second buffer input, where the first buffer input is coupled to the first amplifier input, the first cathode, and the second anode. Also, the second buffer input and the buffer output are coupled to the first anode and the second cathode.

In accordance with at least one example of the description, a circuit formed in a semiconductor substrate has a top surface. The circuit includes an operational amplifier having an amplifier output, a first amplifier input, and a second amplifier input. The circuit includes a first diode. The first diode includes a first cathode formed by a first N-doped region at the top surface in a first P-doped well. The first diode also includes a first anode formed by a first P-doped region at the top surface in the first P-doped well, the first N-doped region spaced away from the first P-doped region. The first diode includes a DNBL, the first P-doped well situated between the top surface and the DNBL. The first diode also includes a first N-doped well extending from the top surface to the DNBL. The circuit includes a second diode. The second diode includes a second cathode formed by a second N-doped region at the top surface in a second N-doped well. The second diode also includes a second anode formed by a second P-doped region at the top surface in the second N-doped well. The second diode includes a DPBL, the second N-doped well situated between the top surface and the DPBL. The second diode also includes a second P-doped well extending from the top surface to the DPBL.

BRIEF DESCRIPTION OF THE DRAWINGS

The same reference numbers or other reference designators are used in the drawings to designate the same or similar (functionally and/or structurally) features.

DETAILED DESCRIPTION

In metal-oxide semiconductor (MOS) based input stage op-amps, $I_B$ is provided by diodes connected to input terminals. The diodes may be coupled to the input terminals to provide input gate protection and ESD protection. In junction-isolated processes, several parasitic junctions are present in the diodes that contribute to leakage currents, which may prevent precise operation of the op-amp. Also, voltages across the diodes result in leakage currents. In a conventional solution, a buffer minimizes the voltage across the diodes to achieve lower leakage. However, the saturation current at zero bias voltage may still be tens or hundreds of picoamps (pA) for standard diodes. Therefore, standard diodes may be inadequate in applications where ultra-low $I_B$ is useful.

In examples herein, multiple ultra-low leakage diode structures are described. One example structure is a N+/P-well diode, and the second structure is a P+/N-well diode. In the first structure, one terminal of the diode is coupled to an N+ doped region (e.g., a heavily doped N-doped region) surrounded by a P-well (e.g., a P-doped well). The other terminal of the diode is coupled to a P+ doped region surrounded by the P-well. In this structure, the parasitic junctions are shorted using a guard buffer voltage source. In examples herein, P-doped regions may be referred to as P-doped or P+ doped regions. Also, in examples herein, N-doped regions may be referred to as N-doped or N+ doped regions.

In a second example structure, one terminal of the diode is coupled to a P+ doped region surrounded by an N-well (e.g., an N-doped well). The other terminal of the diode is coupled to an N+ region surrounded by the N-well. In this structure, a deep P-type buried layer (DPBL) and a deep N-type buried layer (DNBL) are added between the actual diode and the substrate. Parasitic junctions are shorted to a guard buffer.

In examples herein, a terminal of the diode that is coupled to a sensitive node (such as the input of an op-amp) is made up of either N+ or P+ layers. The other terminal of the diode is an N-well or P-well. Therefore, the junction area on the sensitive node is the area of the diode that is needed, and no parasitic junction is connected to the sensitive node. The other terminal is connected to a low-impedance node so any leakage from this terminal is provided by the low impedance circuit. In junction-isolated processes, having the substrate at a different potential than the inputs results in leakage currents. To further decrease leakage currents, the diodes are separated from the substrate using DPBL and/or DNBL, and both layers are connected to the low impedance node. Therefore, any leakage current from the lower layers is provided by the low impedance node, and the diode terminals that are connected to the input pins of the op-amp have minimal current leaking. This structure ensures the input bias current is ultra-low, such as a sub-picoamp current.

Figure 1:
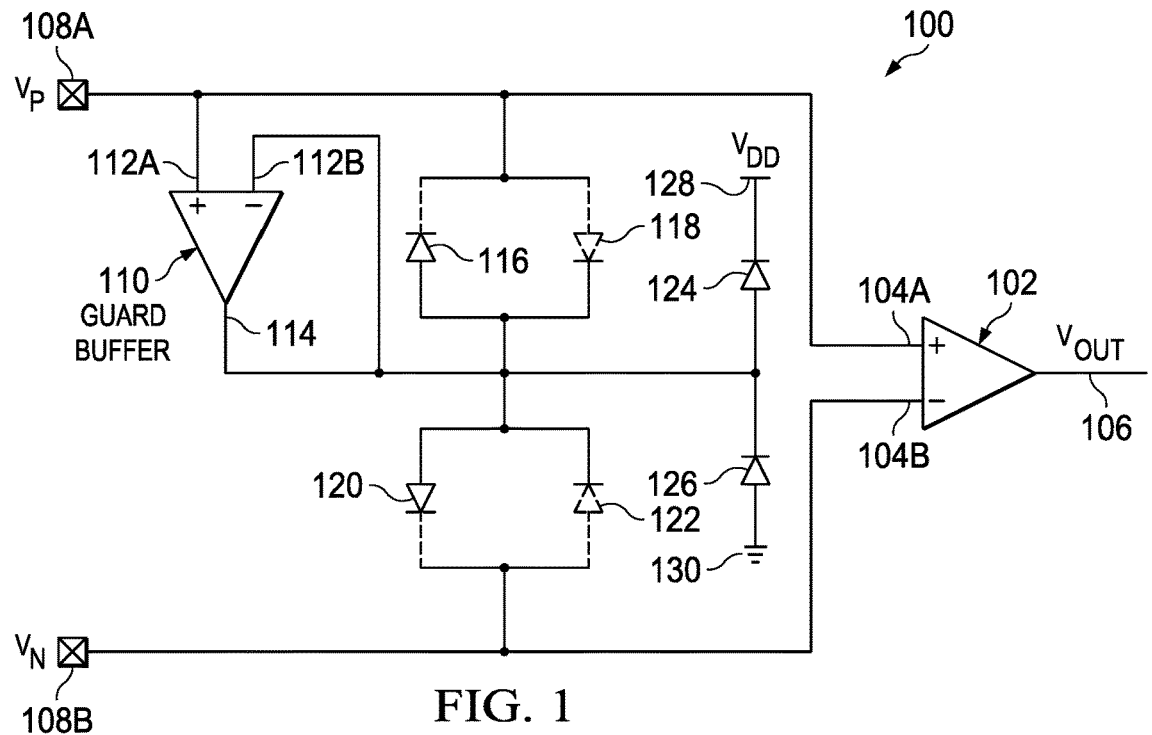
FIG. 1 is diagram of a circuit of a bootstrapped ESD structure for an op-amp with ultra-low leakage diodes in accordance with various examples.

FIG. 1 is a diagram of a circuit 100 of a bootstrapped ESD structure for an op-amp with ultra-low leakage diodes in accordance with various examples herein. Circuit 100 includes amplifier 102. Amplifier 102 has a first amplifier input 104A, a second amplifier input 104B, and an amplifier output 106, which produces a voltage VOUT. A positive input terminal 108A ($V_P$) is coupled to first amplifier input 104A, and a negative input terminal 108B ($V_N$) is coupled to second amplifier input 104B. Circuit 100 includes a guard buffer 110. Guard buffer 110 has a first input 112A, a second input 112B, and an output 114. First input 112A is coupled to positive input terminal 108A. Second input 112B is coupled to output 114.

Circuit 100 includes a bootstrapped ESD structure that includes diodes 116, 118, 120, and 122. Diodes 116, 118, 120, and 122 are ultra-low leakage diodes that have one of the diode structures described herein. The bootstrapped ESD structure provides a low-leakage ESD solution for both inputs (104A and 104B) of amplifier 102. In the example shown in circuit 100, diodes 116 and 120 are N+/P-well diodes, and diodes 118 and 122 are P+/N-well diodes. Other configurations of the ultra-low leakage diodes may be useful in other examples. The cathode of diode 116 (e.g., a first diode) is coupled to first amplifier input 104A and the anode of diode 118 (e.g., a second diode). The anode of diode 116 is coupled to output 114 of guard buffer 110 and to the cathode of diode 118. Likewise, the cathode of diode 120 (e.g., a third diode) is coupled to second amplifier input 104B and the anode of diode 122 (e.g., a fourth diode). The anode of diode 120 is coupled to output 114 of guard buffer 110 and to the cathode of diode 122.

Circuit 100 also includes diodes 124 and 126. In this example, diodes 124 and 126 are not necessarily ultra-low leakage diodes, and may instead be conventional diodes. The cathode of diode 124 is coupled to a voltage supply 128 that provides a voltage $V_{DD}$. The anode of diode 124 is coupled to output 114 of guard buffer 110 and to the cathode of diode 126. The anode of diode 126 is coupled to ground 130 (or to another voltage source).

Diodes 116 and 118 provide ESD protection for first amplifier input 104A, while diodes 120 and 122 provide ESD protection for second amplifier input 104B. Because diodes 116, 118, 120, and 122 are ultra-low leakage diodes as described herein, amplifier 102 has low input bias current $I_B$. In some examples, $I_B$ may be as low as 40 femtoamps (fA).

Circuit 100 shows one example structure where ultra-low leakage diodes may be useful: to provide input gate protection and ESD protection for an amplifier. Ultra-low leakage diodes may be useful in any other application where it is advantageous to reduce diode leakage currents. Other applications may include gas chromatography and pH probe amplifiers.

Figure 2B:
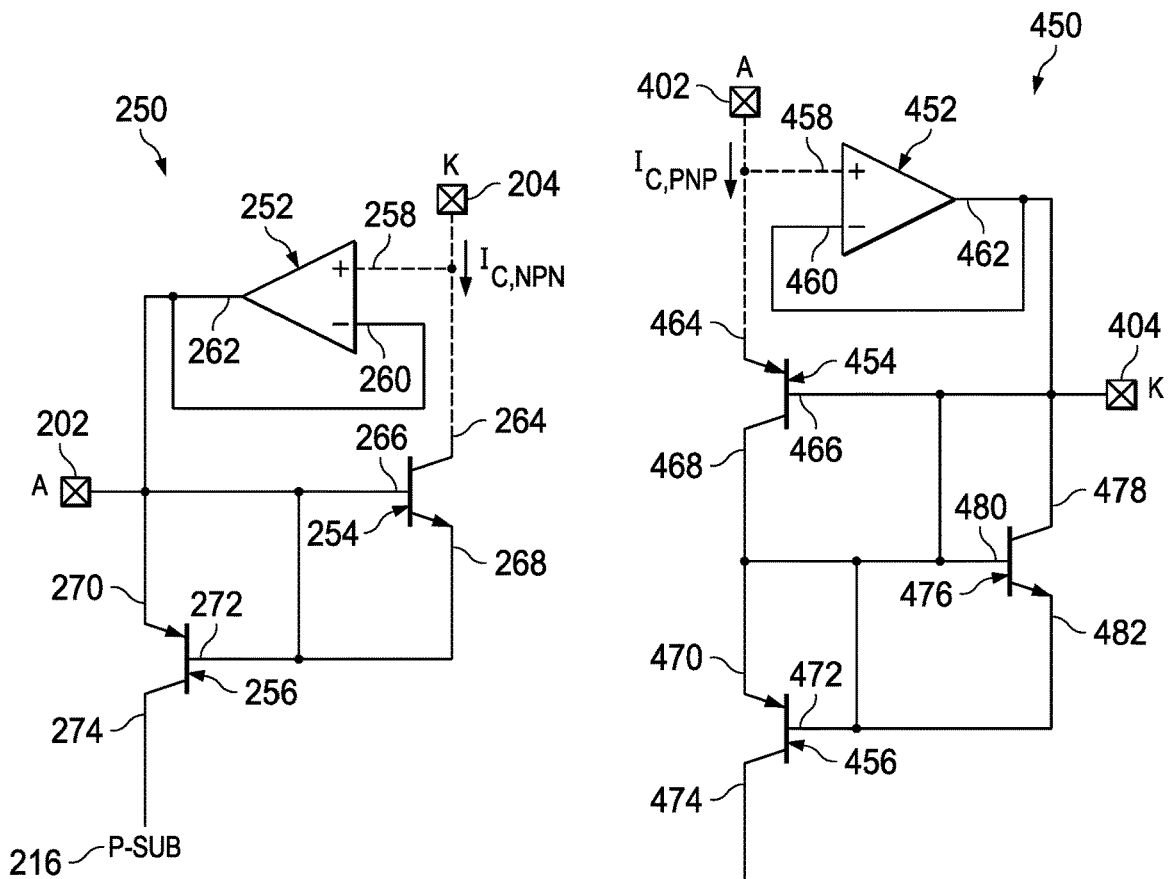
FIG. 2B is an equivalent circuit diagram of an ultra-low leakage N+/P-well diode structure in accordance with various examples.
Figure 2A:
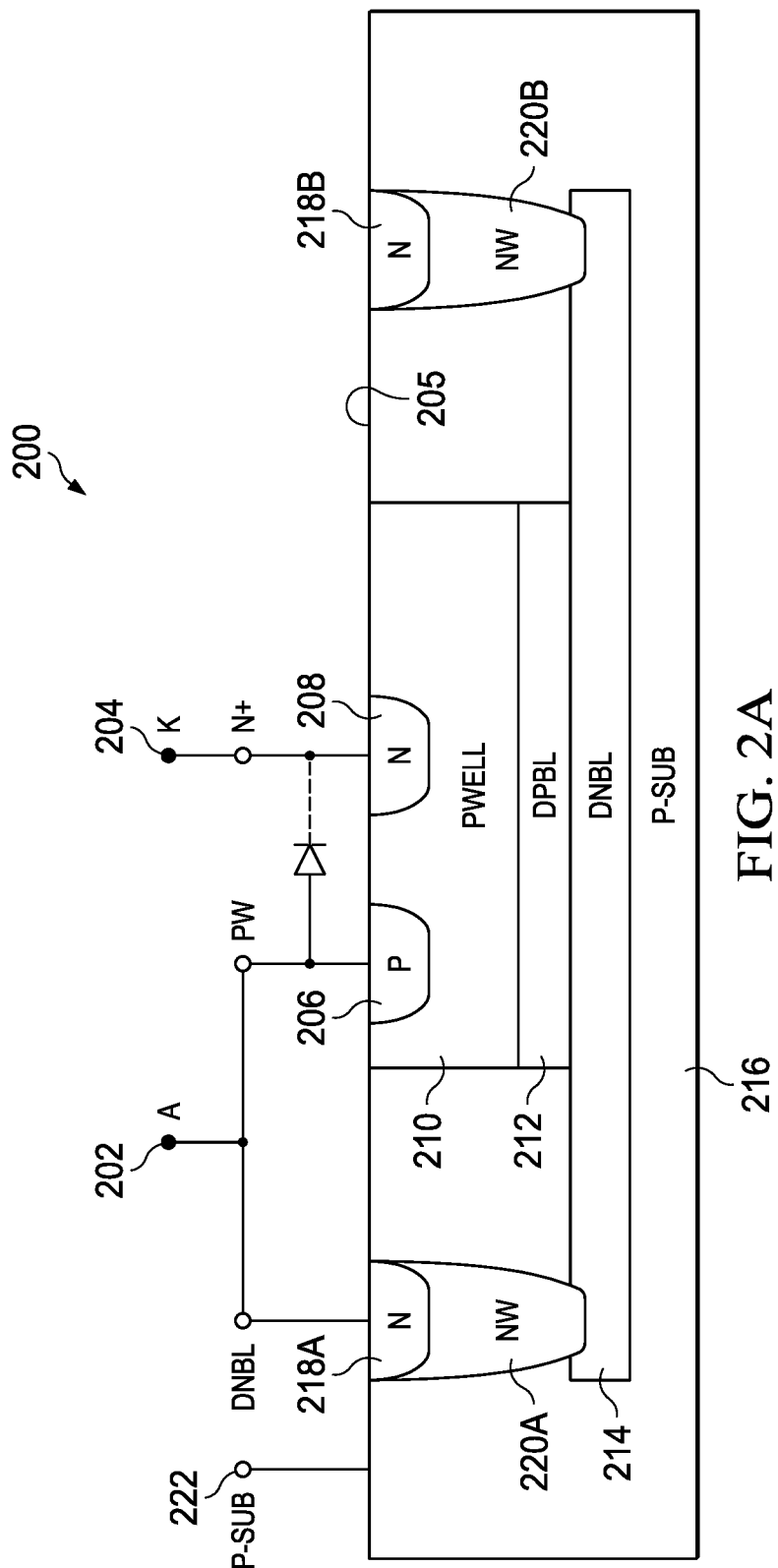
FIG. 2A is a cross-section diagram of an ultra-low leakage N+/P-well diode structure in accordance with various examples.

FIG. 2A is a cross-section diagram of an ultra-low leakage N+/P-well diode structure 200 in accordance with various examples herein. Diode structure 200 includes an anode 206 and a cathode 208. The anode 206 is formed by a P+ doped region and is connected to anode terminal 202. The cathode 208 is formed by an N+ doped region and is connected to cathode terminal 204. Diode structure 200 includes a top surface 205. Anode 206 and cathode 208 may each be any suitable size or have any suitable doping concentration. As an example, the P+ and the N+ doping concentrations may be in the range of $5 \times 10^{18}$ to $5 \times 10^{20}$ atoms/cm$^3$. Also, the P+ regions may be doped with boron and the N+ regions may be doped with either phosphorus or arsenic in some examples. Both anode 206 and cathode 208 reside within P-well 210 in this example. P-well 210 extends downward from top surface 205. P-well 210 is adjacent to DPBL 212. DPBL 212 is adjacent to DNBL 214. P-well 210, DPBL 212, and DNBL 214 are surrounded by P-type substrate 216 in this example. Also, diode structure 200 includes N+ doped region 218A and N+ doped region 218B. N+ doped region 218A and N+ doped region 218B extend downward from top surface 205. N+ doped region 218A is located within N-well 220A. N+ doped region 218B is located within N-well 220B. N+ doped region 218A, N+ doped region 218B, N-well 220A, N-well 220B, and DNBL 214 isolate P-well 210 from P-type substrate 216. In some example embodiments, N+ doped region 218A, N+ doped region 218B, N-well 220A, N-well 220B provide an electrical connection to DNBL 214, so that a bias may be applied to N+ doped region 218A and/or N+ doped region 218B to bias DNBL 214.

In this example, a P-sub terminal 222 is coupled to P-type substrate 216. Also, the P-well 210 is coupled to the DNBL 214, which is shown as a connection to the anode terminal 202. Coupling the P-well 210 to the DNBL 214 provides low leakage for the diode structure 200. In some example embodiments, P-sub terminal 222 may be used to provide a bias to substrate 216. In some embodiments, P-well 210 and/or DPBL 212 may extend laterally from N-well 220A to N-well 220B. In the example embodiment illustrated in FIG. 2A, P-well 210 and DPBL 212 do not extend to N-well 220A to N-well 220B. The area between P-well 210/DPBL 212 and N-well 220A/N-well 220B may be comprised of P-type semiconductor (e.g., single-crystal silicon or epitaxial silicon) doped at the same concentration of P-sub 216. In the embodiment illustrated in FIG. 2A, P-well 210 (and, possibly, DPBL 212) are electrically connected to DNBL 214 (e.g., shorted together) to form the anode terminal.

FIG. 2B is an equivalent circuit diagram 250 of the ultra-low leakage N+/P-well diode structure 200 of FIG. 2A in accordance with various examples herein. Circuit diagram 250 includes an anode terminal 202 and a cathode terminal 204, which represent the anode terminal 202 and cathode terminal 204 in diode structure 200. Circuit diagram 250 includes guard buffer 252, parasitic transistor 254, and parasitic transistor 256. A guard buffer 252 (e.g., guard buffer 110 in FIG. 1) has a first input 258 coupled to cathode terminal 204. A second input 260 is coupled to an output 262 of guard buffer 252. The output 262 is also coupled to anode terminal 202. As shown in FIG. 1, in one example, a cathode of diode 116 is coupled to first input 112A. The anode of diode 116 is coupled to second input 112B and output 114 of guard buffer 110. The guard buffer 252 in FIG. 2B is coupled to the diode in a similar manner in this example.

Referring again to FIG. 2B, parasitic transistor 254 is an NPN transistor (e.g., a bipolar transistor or BJT). An NPN transistor is constructed with a P-type semiconductor placed between two N-type semiconductors. An NPN transistor behaves like two PN junction diodes connected back-to-back. These back-to-back PN junction diodes are known as the collector-base junction and the base-emitter junction. Parasitic transistor 254 includes collector 264, base 266, and emitter 268. The NPN structure of parasitic transistor 254 is formed (as shown in FIG. 2A) by cathode 208 (e.g., collector 264), P-well 210/DPBL 212 (e.g., base 266), and DNBL 214 (e.g., emitter 268). The collector 264 is coupled to cathode terminal 204 in FIG. 2B, just as cathode terminal 204 is coupled to cathode 208 in FIG. 2A. Base 266 is P-type material (e.g., P-well 210) that is coupled to anode terminal 202. Emitter 268 is N-type material (e.g., DNBL 214), that is coupled to the anode terminal 202 via the connection in FIG. 2A that connects anode 206 to N+ doped region 218A.

In FIG. 2B, anode terminal 202 is coupled to an output 262 of guard buffer 252. Also, anode terminal 202 is coupled to base 266 of parasitic transistor 254. As described above, the base 266 is formed by P-well 210 in FIG. 2A. Therefore, anode terminal 202 is also shown as coupled to P-well 210 in FIG. 2A via the anode 206. Anode terminal 202 is also coupled to parasitic transistor 256. Parasitic transistor 256 is a PNP transistor. A PNP transistor is constructed with an N-type semiconductor placed between two P-type semiconductors. Parasitic transistor 256 includes emitter 270, base 272, and collector 274. Emitter 270 (P-type) is coupled to anode terminal 202 and output 262 of guard buffer 252. Base 272 (N-type) is coupled to base 266 and emitter 268 of parasitic transistor 254. Collector 274 (P-type) is coupled to P-type substrate 216.

The structure of parasitic transistor 256 is also reflected in FIG. 2A. Emitter 270, coupled to the anode, is formed by anode 206 in FIG. 2A. Base 272 (N-type) is formed by DNBL 214 in FIG. 2A, which is also emitter 268 of parasitic transistor 254. Collector 274 is formed by the P-type substrate 216 in FIG. 2A. Contact to P-type substrate 216 can be implemented by P-sub terminal 222. Alternatively, a deep, P-type well and/or a P+ contact can be formed in the substrate (similar to structures 220A and 218A, respectively, but opposite in conductivity type) to form a lower resistance contact with the substrate. Therefore, the structure of parasitic transistors 254 and 256 are reflected in the cross-section diagram of diode structure 200 of FIG. 2A.

The structure of FIG. 2B is also reflected in FIG. 1. In FIG. 2B, guard buffer 252 has a first input 258 coupled to the cathode terminal 204, and an output 262 coupled to anode terminal 202. In FIG. 1, guard buffer 110 has a first input 112A coupled to the cathode of diode 116. Also, output 114 of guard buffer 110 is coupled to the anode of diode 116. Therefore, diode 116 of FIG. 1 is connected similarly to the diode represented in FIG. 2B.

Diode structure 200 provides a low-leakage diode due to the structure and connections of the different P-type and N-type regions. The current into the collector of an NPN transistor ($I_{C,NPN}$) depends on the base-emitter voltage of the NPN transistor and the collector-base voltage. This current is the current from the cathode terminal 204 as shown in FIG. 2B. The current into the collector is described with Equation 1:

$$I_{C,NPN} = I_S\left(1 + \frac{1}{\beta}\right)\left(1 - e^{\frac{V_{BC,NPN}}{V_T}}\right) \quad (1)$$

In Equation (1), $I_S$ is the saturation current where the base-emitter voltage is zero. $\beta$ is the beta (e.g., transistor current gain) of the transistor. $V_{BC,NPN}$ is the base-collector voltage of the transistor. $V_T$ is the threshold voltage of the transistor. As shown in Equation (1), $I_{C,NPN}$ can be driven to zero if either of the two values in parentheses on the right side of Equation (1) are equivalent to 0. To drive the second parenthetical value to 0, the value of the exponent of e can be set to 0. If the exponent of e is 0, e to the $0^{th}$ power is 1, and 1-1 in the second parenthetical is 0. Therefore, the current into the cathode $I_{C,NPN}$ can be driven to 0 if $V_{BC,NPN}$ is 0. As shown in FIG. 2B, guard buffer 252 is coupled between the base 266 and collector 264 of parasitic transistor 254. Therefore, the base-collector voltage of parasitic transistor 254 is the offset of guard buffer 252. The guard buffer 252 may be trimmed in some examples so that its offset voltage is zero. By using a guard buffer 252 and coupling it to the low-leakage diode as shown in FIGS. 1 and 2B, the current $I_{C,NPN}$ into the collector is driven to zero or nearly zero, such as a current below approximately 50 femtoamps. Therefore, as shown in FIG. 1, the current into first amplifier input 104A (or second amplifier input 104B) may be zero or nearly zero using low-leakage diodes as described herein along with a guard buffer.

Figure 3:
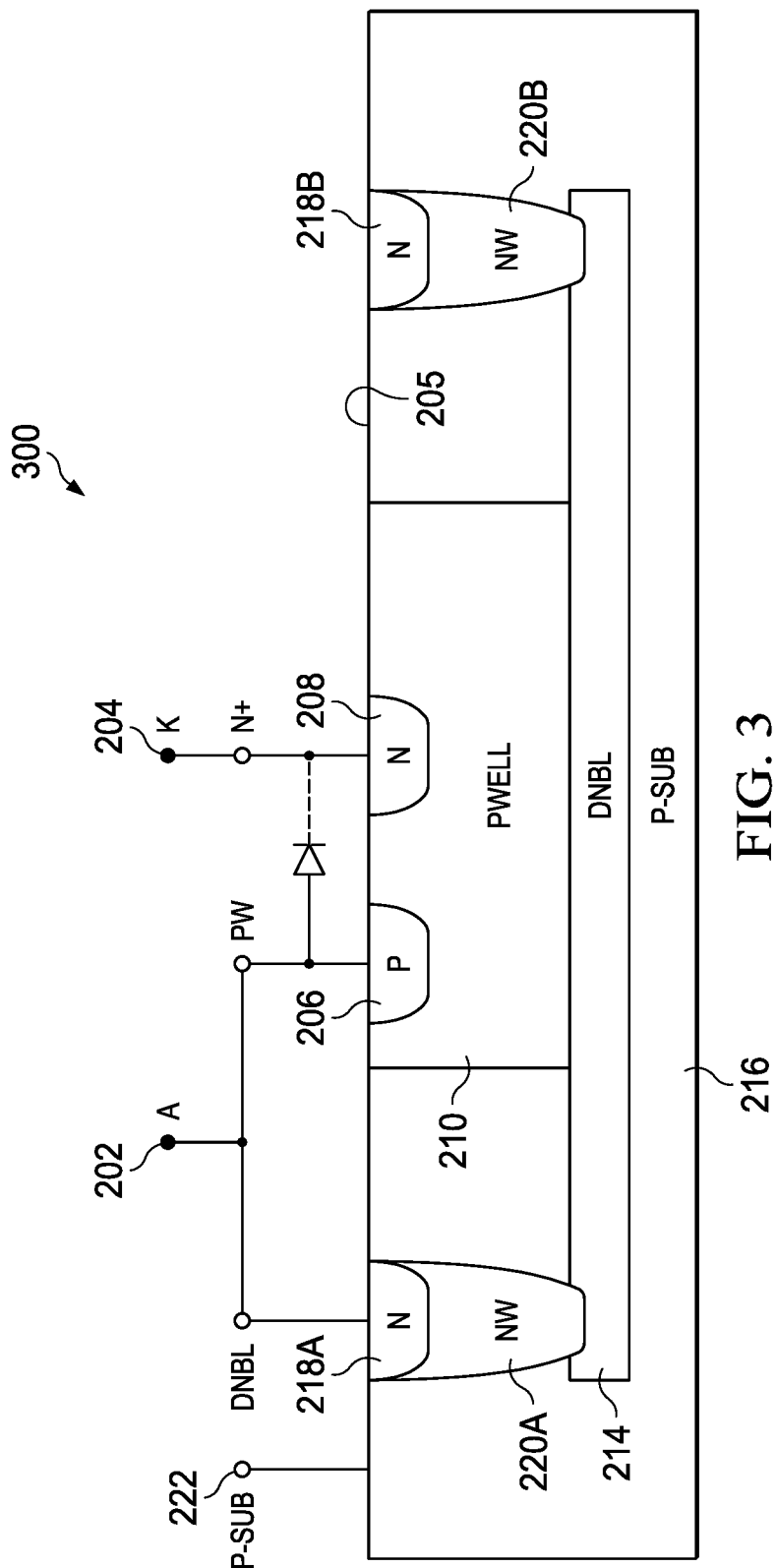
FIG. 3 is a cross-section diagram of an ultra-low leakage N+/P-well diode structure in accordance with various examples.

FIG. 3 is a cross-section diagram of an ultra-low leakage N+/P-well diode structure 300 in accordance with various examples herein. Many of the components of diode structure 300 are described above with respect to diode structure 200 in FIG. 2A, and like numbers denote like components. Diode structure 300 is similar to diode structure 200, but diode structure 300 does not include a deep P-type buried layer (DPBL) as shown in FIG. 2A. In this example, P-well 210 contacts (electrically and/or physically) DNBL 214 without an intervening DPBL. The operation of diode structure 300 is similar to the operation of diode structure 200 described above. Also, equivalent circuit diagram 250 described above with respect to FIG. 2B is also an equivalent circuit diagram for diode structure 300.

Figure 4B:
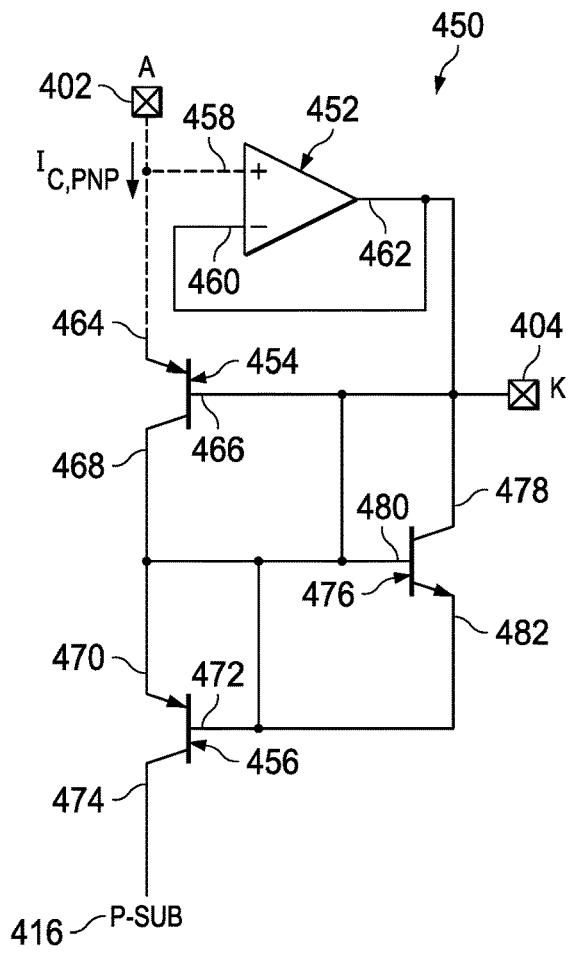
FIG. 4B is an equivalent circuit diagram of an ultra-low leakage P+/N-well diode structure in accordance with various examples.
Figure 4A:
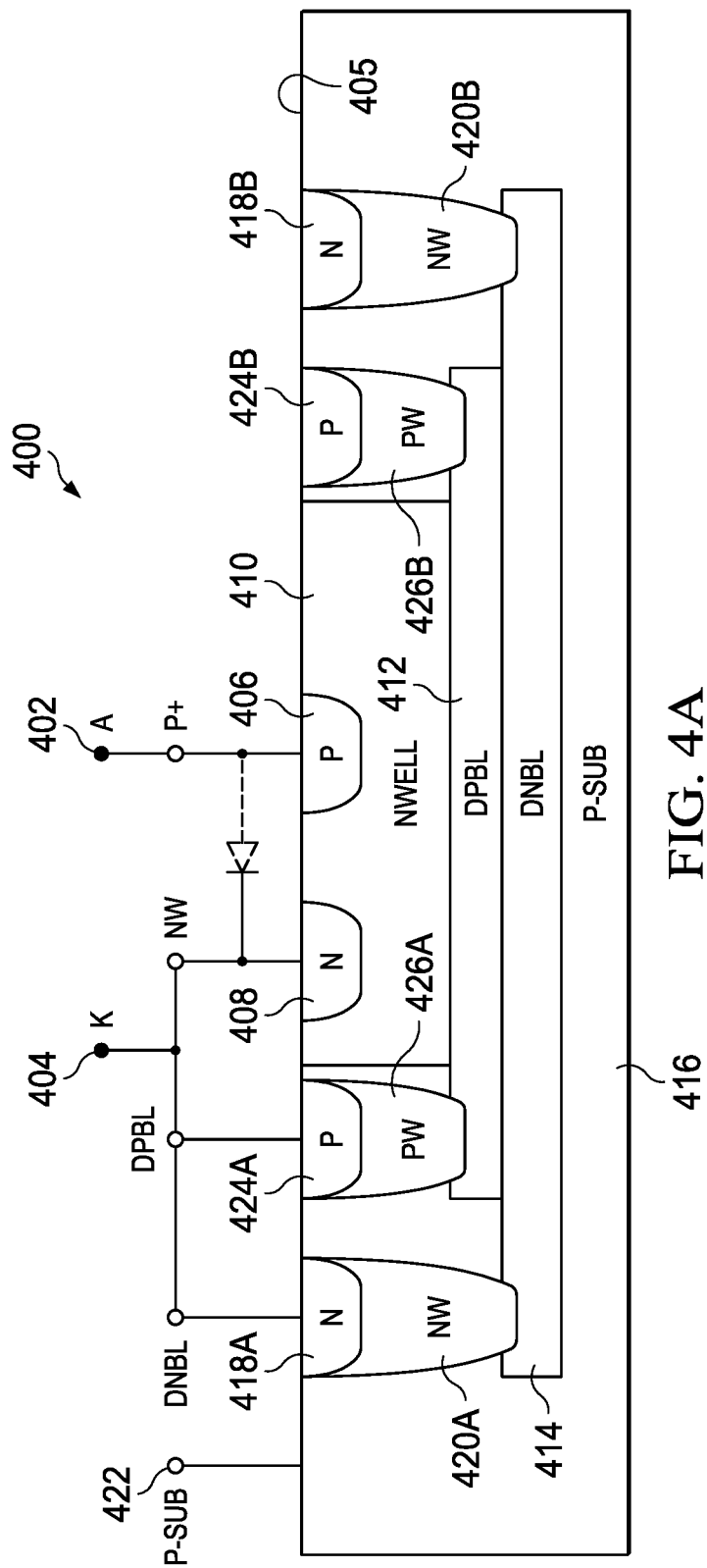
FIG. 4A is a cross-section diagram of an ultra-low leakage P+/N-well diode structure in accordance with various examples.

FIG. 4A is a cross-section diagram of an ultra-low leakage P+/N-well diode structure 400 in accordance with various examples herein. Diode structure 400 includes an anode terminal 402 and a cathode terminal 404. The anode terminal 402 is coupled to a P+ doped region 406 (e.g., an anode). The cathode terminal 404 is coupled to an N+ doped region 408 (e.g., a cathode). Diode structure 400 includes a top surface 405. P+ doped region 406 and N+ doped region 408 may each be any suitable size or have any suitable doping concentration. As an example, the P+ and the N+ doping concentrations may be in the range of $5 \times 10^{18}$ to $5 \times 10^{20}$ atoms/cm$^3$. Also, the P+ regions may be doped with boron and the N+ regions may be doped with either phosphorus or arsenic in some examples. Both P+ doped region 406 and N+ doped region 408 reside within N-well 410 in this example. N-well 410 extends downward from top surface 405. N-well 410 is adjacent to DPBL 412 and may be adjacent to P-wells 426A and 426B. DPBL 412 is adjacent to DNBL 414. N-well 410, DPBL 412, and DNBL 414 are surrounded by P-type substrate 416 in this example.

Diode structure 400 also includes N+ doped region 418A and N+ doped region 418B. N+ doped region 418A is located within N-well 420A and may provide a lower resistance contact to N-well 420A. N+ doped region 418B is located within N-well 420B. N+ doped region 418A and N+ doped region 418B extend downward from top surface 405. Diode structure 400 includes P-sub terminal 422 coupled to P-type substrate 416. A P-well (similar to P-well 426A) and/or a P+ doped region (similar to P+ doped regions 424A) may be used to create a lower resistance contact to the P-type substrate 416. Diode structure 400 includes P+ doped region 424A and P+ doped region 424B. P+ doped region 424A is located within P-well 426A, and P+ doped region 424B is located within P-well 426B. P-well 426A and P-well 426B extend downward from top surface 405. These P-doped structures may be used to provide a lower resistance contact to DPBL 412. In addition, P+ doped regions 424A and 424B, P-wells 426A and 426B, and DPBL 412 isolate N-well 410 from P-type substrate 416. Also, N+ doped region 418A and 418B, N-wells 420A and 420B, and DNBL 414 isolate the P+ doped regions 424A and 424B and the P-wells 426A and 426B from P-type substrate 216. In addition, N+ doped region 418A and 418B and/or N-wells 420A and 420B provide lower resistance contact to DNBL 414.

FIG. 4B is an equivalent circuit diagram 450 of the ultra-low leakage P+/N-well diode structure 400 of FIG. 4A in accordance with various examples herein. Circuit diagram 450 includes an anode terminal 402 and a cathode terminal 404, which represent the anode terminal 402 and cathode terminal 404 in diode structure 400. Circuit diagram 450 includes guard buffer 452, parasitic transistor 454, parasitic transistor 476 and parasitic transistor 456.

A guard buffer 452 (e.g., guard buffer 110 in FIG. 1) has a first input 458 coupled to anode terminal 402. A second input 460 of guard buffer 452 is coupled to an output 462 of guard buffer 452. The output 462 is also coupled to cathode terminal 404. As shown in FIG. 1, in one example, an anode of diode 118 is coupled to first input 112A. The cathode of diode 118 is coupled to second input 112B and output 114 of guard buffer 110. The guard buffer 452 in FIG. 4B is coupled to the diode in a similar manner in this example.

Parasitic transistor 454 is a PNP transistor. Parasitic transistor 454 includes emitter 464, base 466, and collector 468. The PNP structure of parasitic transistor 454 is depicted in FIG. 4A as P+ doped region 406, N-well 410, and DPBL 412 (e.g., PNP). The emitter 464 (e.g., P+ doped region 406) is coupled to anode terminal 402 in FIG. 4B, just as anode terminal 402 is coupled to P+ doped region 406 in FIG. 4A. Base 466 is N-type material (e.g., N-well 410) that is coupled to cathode terminal 404. Collector 468 is P-type material (e.g., DPBL 412), that is coupled to the cathode terminal 404 via the connection in FIG. 4A that connects N+ doped region 408 to P+ doped region 424A.

In FIG. 4B, parasitic transistor 456 is also a PNP transistor. Parasitic transistor 456 includes emitter 470, base 472, and collector 474. The PNP structure of parasitic transistor 456 is depicted in FIG. 4A as DPBL 412, DNBL 414, and P-type substrate 416. Since emitter 470 and collector 468 are formed by DPBL 412, emitter 470 is coupled to collector 468. Base 472 is formed by DNBL 414, which is coupled to emitter 470 (DPBL 412) via N-well 420A, N+ doped region 418A, P-well 426A, P+ doped region 424A and the connections coupled to cathode terminal 404 in FIG. 4A. These connections are also shown in FIG. 4B, with base 466, emitter 470, and base 472 all coupled to cathode terminal 404. Collector 474 is formed by P-type substrate 416, as shown in FIG. 4B.

FIG. 4B also includes parasitic transistor 476 coupled to cathode terminal 404. Parasitic transistor 476 is an NPN transistor in this example. Parasitic transistor 476 includes collector 478, base 480, and emitter 482. Collector 478 is formed by N+ doped region 408 and/or N-well 410 in FIG. 4A. Base 480 is formed by DPBL 412 in FIG. 4A. Emitter 482 is formed by DNBL 414 in FIG. 4A. As described above, base 480, base 466, and base 472 are all coupled to cathode terminal 404, which is shown in FIG. 4A as the connections to cathode terminal 404. Therefore, the parasitic transistors in equivalent circuit diagram 450 are reflected in diode structure 400.

Diode structure 400 provides a low-leakage diode due to the structure and connections of the different P-type and N-type regions. The current into the emitter of a PNP transistor ($I_{E,PNP}$) depends on the base-collector voltage of the PNP transistor (e.g., parasitic transistor 454) and the base-emitter voltage. The current into the anode terminal 402 is described with Equation 2:

$$I_{E,PNP} = I_S \left(1 + \frac{1}{\beta}\right)\left(e^{\frac{V_{EB,PNP}}{V_T}} - 1\right) \quad (2)$$

In Equation (2), $I_S$ is the saturation current where the base-collector voltage is zero. β is the beta (e.g., transistor current gain) of the transistor. $V_{EB,PNP}$ is the base-emitter voltage of the transistor. $V_T$ is the threshold voltage of the transistor. As shown in Equation (2), $I_{E,PNP}$ can be driven to zero if either of the two values in parentheses on the right side of Equation (2) are equivalent to 0. To drive the second parenthetical value to 0, the value of the exponent of e can be set to 0. If the exponent of e is 0, e to the $0^{th}$ power is 1, and 1-1 in the second parenthetical is 0. Therefore, the current into the anode $I_{E,PNP}$ can be driven to 0 if $V_{EB,PNP}$ is 0. As shown in FIG. 4B, guard buffer 452 is coupled between the base 466 and emitter 464 of parasitic transistor 454. Therefore, the base-emitter voltage of parasitic transistor 454 is the offset of guard buffer 452. The guard buffer 452 may be trimmed in some examples so that its offset voltage is zero. By using a guard buffer 452 and coupling it to the low-leakage diode as shown in FIGS. 1 and 4B, the current into the anode $I_{E,PNP}$ is driven to zero or nearly zero, such as a current below approximately 50 femtoamps. Therefore, as shown in FIG. 1, the current into first amplifier input 104A (or second amplifier input 104B) may be zero or nearly zero using low-leakage diodes as described herein along with a guard buffer.

Figure 5:
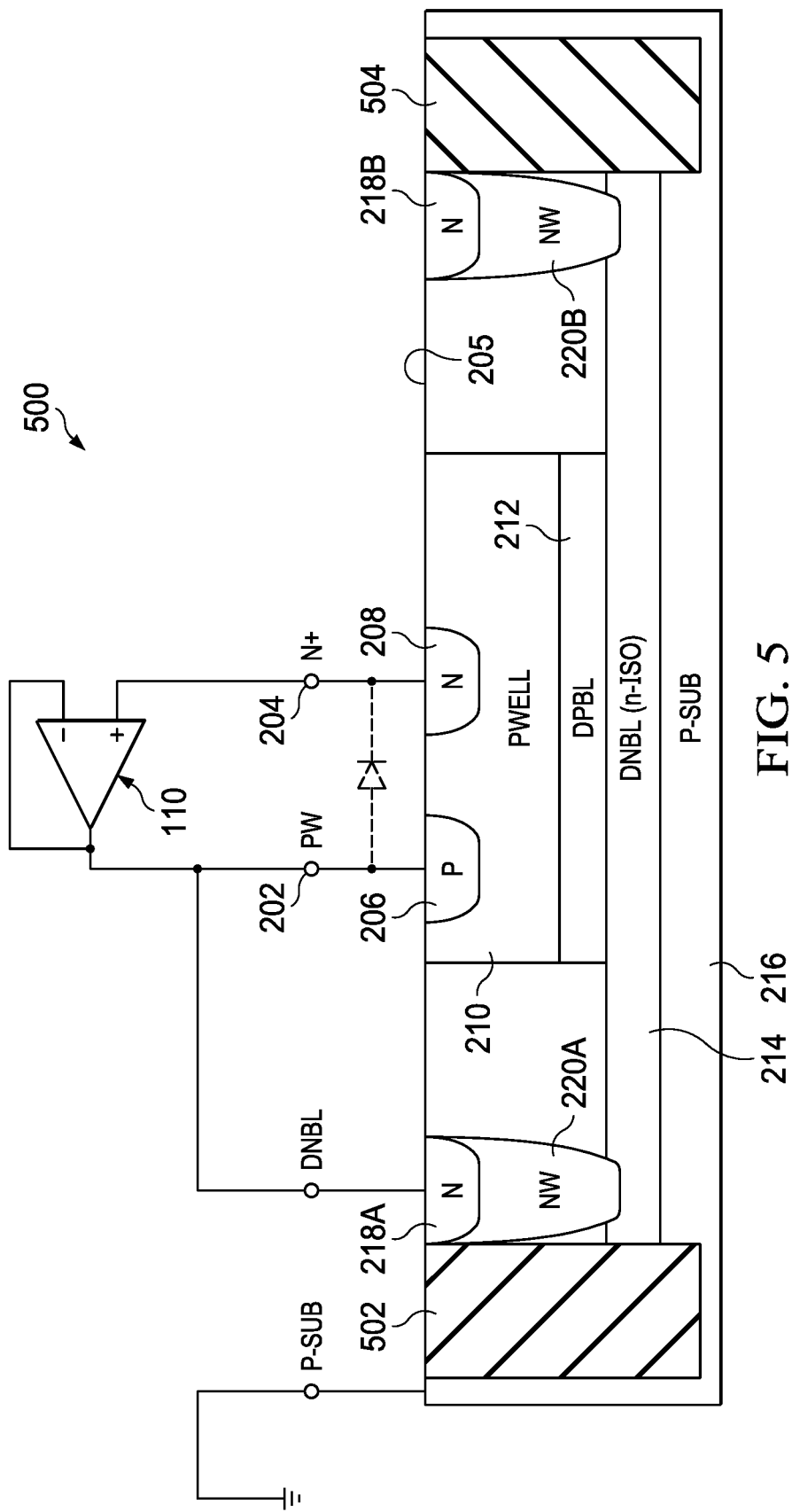
FIG. 5 is a cross-section diagram of an ultra-low leakage N+/P-well diode structure in accordance with various examples.

FIG. 5 is a cross-section diagram of an ultra-low leakage N+/P-well diode structure 500 in accordance with various examples herein. Many of the components of diode structure 500 are described above with respect to diode structure 200 in FIG. 2A, and like numbers denote like components. Diode structure 500 operates similarly to diode structure 200 described above. Diode structure 500 is similar to diode structure 200, but diode structure 500 includes isolation trenches 502 and 504. Trench isolation is a technique that provides isolation for active regions in a silicon substrate by creating trenches that are filled or lined with silicon dioxide, silicon nitride, undoped polycrystalline silicon and/or layers or mixtures of the above. In some examples, an isolation structure may be formed as a continuous ring (e.g., extending into and out of the page) around the diode structure such that isolation regions 502 and 504 are cross-sectional views of the same ring-shaped isolation structure. In a similar fashion, N-wells 220A and 220B and N+ doped regions 218A and 218B may be formed as a continuous ring structure (extending into and out of the page) so that N-well 220 forms one, continuous ring around P-well 210. Trench isolation 502 and 504 may be deep or shallow. In diode structure 500, isolation trenches 502 and 504, along with DNBL 214, perform the isolation to isolate P-well 210 from P-type substrate 216. In this example, isolation trenches perform isolation rather than N-wells 220A and 220B. However, N-wells 220A and 220B may also assist in providing isolation in some examples.

Figure 6:
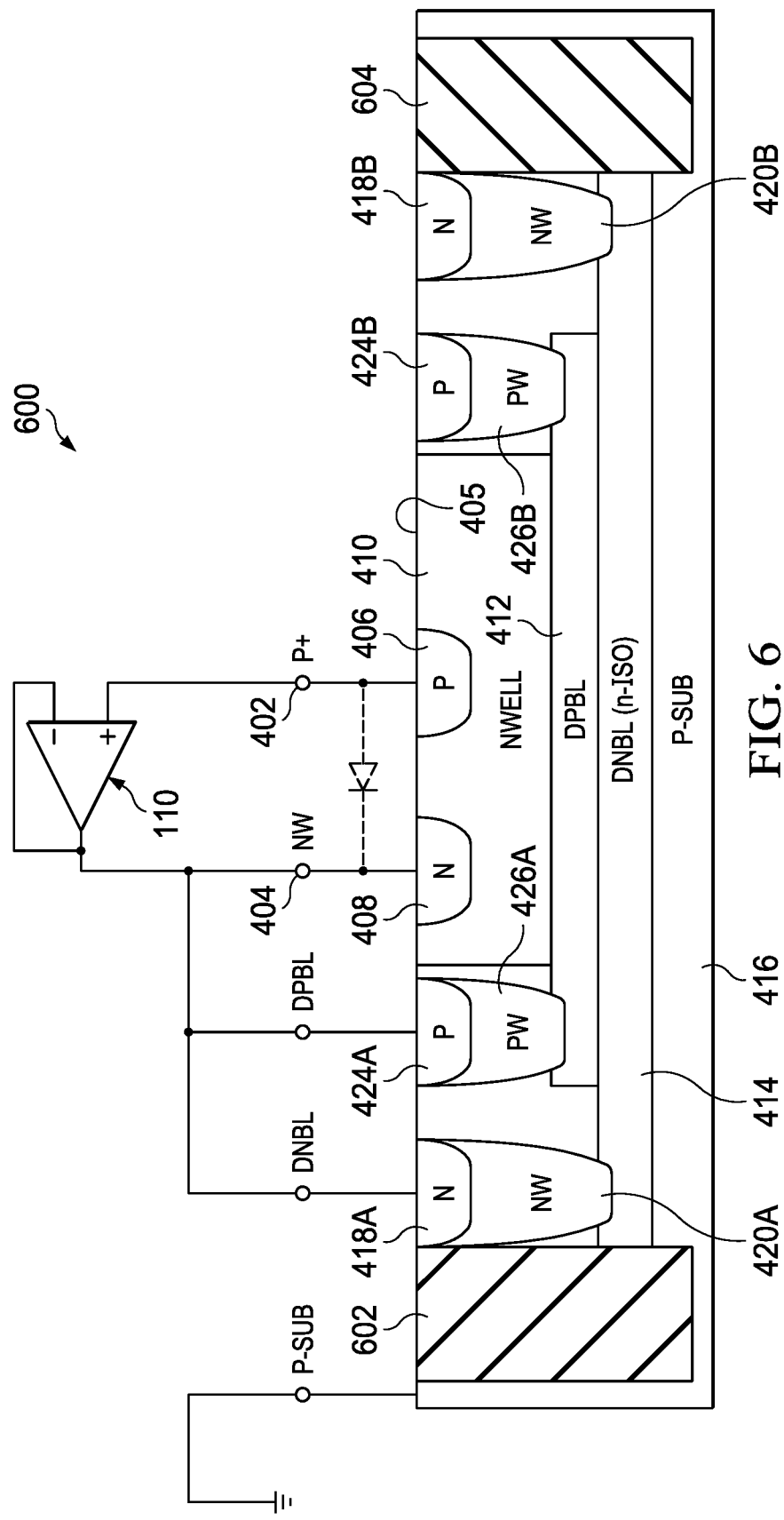
FIG. 6 is a cross-section diagram of an ultra-low leakage P+/N-well diode structure in accordance with various examples.

FIG. 6 is a cross-section diagram of an ultra-low leakage P+/N-well diode structure 600 in accordance with various examples herein. Many of the components of diode structure 600 are described above with respect to diode structure 400 in FIG. 4A, and like numbers denote like components. Diode structure 600 operates similarly to diode structure 400 described above. Diode structure 600 is similar to diode structure 400, but diode structure 600 includes isolation trenches 602 and 604. In diode structure 600, isolation trenches 602 and 604, along with DPBL 412 and DNBL 414, perform the isolation to isolate P-wells 426A and 426B from P-type substrate 416. In this example, isolation trenches perform isolation rather than N-wells 420A and 420B. However, N-wells 420A and 420B may also assist in providing isolation in some examples. Isolation structures 602 and 604 may be formed in a similar manner as isolation structures 502 and 504. In some examples, an isolation structure may be formed as a continuous ring (e.g., extending into and out of the page) around the diode structure such that isolation regions 602 and 604 are cross-sectional views of the same ring-shaped isolation structure. In a similar fashion, N-wells 420A and 420B, P-wells 426A and 426B, P+ doped regions 424A and 424B and N+ doped regions 418A and 418B may be formed as a continuous ring structures (extending into and out of the page) so that N-well 420 forms one, continuous ring between the continuous ring structures for the trench isolation and P-wells 426.

Figure 7A:
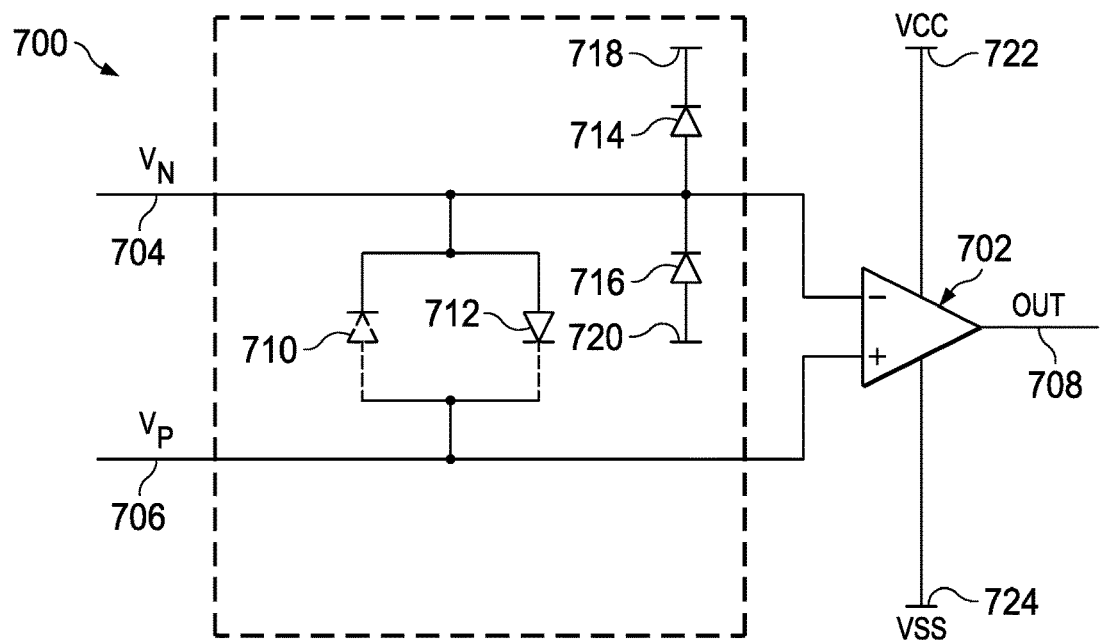
FIG. 7A is a circuit diagram of a low-leakage ESD solution for an op-amp in accordance with various examples.

FIG. 7A is a circuit diagram 700 of a low-leakage ESD solution for an op-amp in accordance with various examples herein. The low-leakage ESD solution is for a single input of the op-amp in this example. Circuit diagram 700 includes an op-amp 702. Op-amp 702 includes a first input 704 that receives an input voltage $V_N$ and a second input 706 that receives an input voltage $V_P$. Op-amp 702 includes an output 708. Circuit diagram 700 includes low-leakage diode 710 and low-leakage diode 712. Circuit diagram 700 also includes diodes 714 and 716. Diode 714 is coupled to a voltage rail 718 (e.g., a higher voltage supply, like $V_{DD}$ or $V_{CC}$, or a lower voltage supply, like ground or $V_{SS}$), and diode 716 is coupled to a voltage rail 720 (e.g., a higher voltage supply, like $V_{DD}$ or $V_{CC}$, or a lower voltage supply, like ground or $V_{SS}$). The anode of diode 714 and the cathode of diode 716 are connected to the $V_N$ terminal (first input 704). Diodes 714 and 716 provide ESD protection for the $V_N$ terminal. ESD protection for $V_P$ terminal (second input 706) is provided via diodes 710, 712, 714 and 716. Op-amp 702 is coupled to a voltage rail 722 ($V_{CC}$) and a voltage rail 724 ($V_{SS}$) to bias op-amp 702.

In operation, the input voltages $V_P$ and $V_N$ are approximately equal, so a guard buffer is not needed in this configuration. FIG. 7A shows an Op-amp 702 with ultra-low input bias current on non-inverting terminal $V_P$ using ultra-low leakage diodes 710 and 712. In this example, low-leakage diode 710 is a P+N-well diode, and low-leakage diode 712 is an N+/P-well diode. If the low-leakage diodes 710 and 712 are configured as shown, op-amp 702 has a low input bias current on non-inverting terminal $V_P$ as described in accordance with examples herein. In one example application, the op-amp 702 in FIG. 7A may be a component of a pH sensor.

Figure 7B:
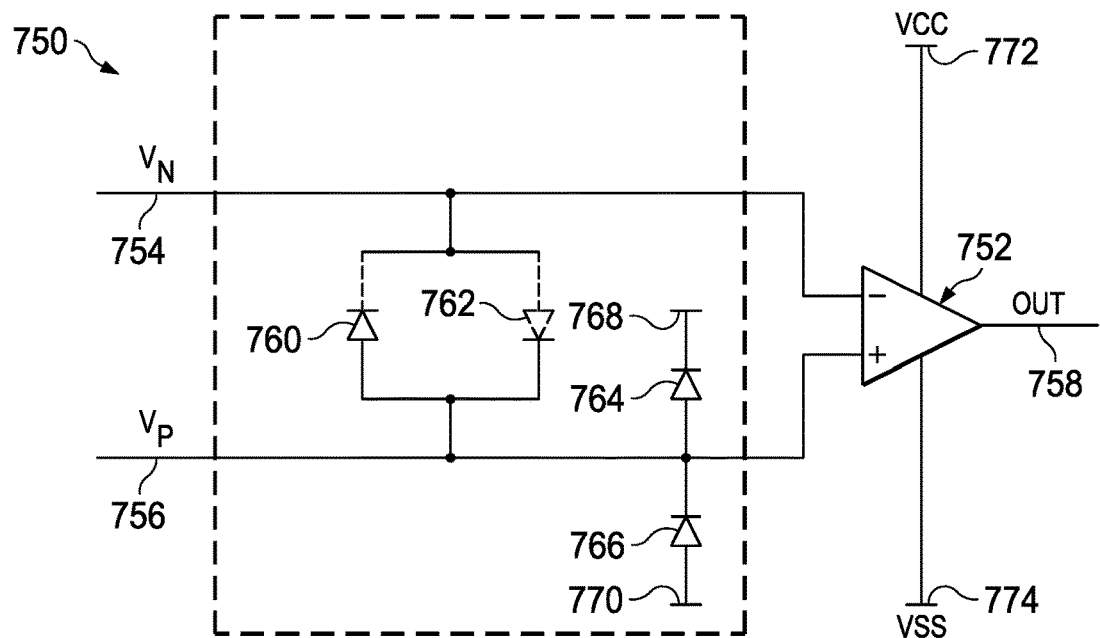
FIG. 7B is a circuit diagram of a low-leakage ESD solution for an op-amp in accordance with various examples.

FIG. 7B is a circuit diagram 750 of a low-leakage ESD solution for an op-amp in accordance with various examples herein. The low-leakage ESD solution is for the inverting input of the op-amp in this example. Circuit diagram 750 includes an op-amp 752. Op-amp 752 includes a first input 754 that receives an input voltage $V_N$ (inverting input terminal) and a second input 756 that receives an input voltage $V_P$ (non-inverting input terminal). Op-amp 752 includes an output 758. Circuit diagram 750 includes low-leakage diode 760 and low-leakage diode 762. Circuit diagram 750 also includes diodes 764 and 766. Diode 764 is coupled to a voltage rail 768 (e.g., a higher voltage supply, like $V_{DD}$ or $V_{CC}$, or a lower voltage supply, like ground or $V_{SS}$), and diode 766 is coupled to a voltage rail 770 (e.g., a higher voltage supply, like $V_{DD}$ or $V_{CC}$, or a lower voltage supply, like ground or $V_{SS}$). The anode of diode 764 and the cathode of diode 766 are shorted to $V_P$ terminal (second input 756). Diodes 764 and 766 provide ESD protection for the $V_P$ node. ESD protection for $V_N$ node (first input 754) is provided via diodes 760, 762, 764 and 766. Op-amp 752 is coupled to a voltage rail 772 ($V_{CC}$) and a voltage rail 774 ($V_{SS}$) to bias op-amp 752.

In operation, the input voltages $V_P$ and $V_N$ are approximately equal (for trimmed precision amplifiers), so a guard buffer is not needed in this configuration. FIG. 7B shows an Op-amp 752 with ultra-low input bias current on inverting terminal $V_N$ using ultra-low leakage diodes 760 and 762. In this example, low-leakage diode 760 is an N+/P-well diode, and low-leakage diode 762 is a P+/N-well diode. If the low-leakage diodes 760 and 762 are configured as shown, op-amp 752 has a low input bias current on inverting terminal $V_N$ as described in accordance with examples herein. In one example application, the op-amp 752 in FIG. 7B may be a component of a transimpedance amplifier.

Two ultra-low leakage diode structures are described in examples herein. A terminal of the diode that is coupled to a sensitive node (such as the input of an op-amp) is made up of either N+ or P+ layers. The other terminal of the diode is formed by an N-well or P-well. Therefore, as described above, no parasitic junction is connected to the sensitive node. The other diode terminal is connected to a low-impedance node, so any leakage from this terminal is provided by the low impedance circuit. Also, the diodes are separated from the substrate using DPBL or DNBL, and those layers are connected to the low impedance node. The diode terminals that are connected to the input pins of the op-amp have minimal current leaking. These structures ensure the input bias current is ultra-low, such as a current below approximately 50 femtoamps in some examples. The examples herein use junction-isolated processes, and may be cheaper than silicon on insulator processes.

The term "couple" is used throughout the specification. The term may cover connections, communications, or signal paths that enable a functional relationship consistent with this description. The term may cover regions that touch or adjacent to one another. As an example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While certain transistors are described herein, other equivalent devices may be used in place of or in connection with these transistors. Furthermore, n-type devices may be replaced with p-type devices and vice versa. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board. As used herein, the term "substrate" or "semiconductor substrate" means a single-crystal semiconductor substrate or a single-crystal semiconductor substrate with an epitaxial semiconductor layer formed on the single-crystal substrate, where the semiconductor material may include silicon, gallium nitride, silicon carbide, gallium arsenide, and/or a layering and/or mixture thereof.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

What is claimed is:

1. A device comprising:
   a semiconductor substrate having a top surface;
   a P-doped well formed in the semiconductor substrate and extending downwardly from the top surface;
   a cathode of a diode formed by an N-doped region in the P-doped well;
   an anode of the diode formed by a P-doped region, the P-doped region spaced away from the N-doped region in the P-doped well;
   a deep N-type buried layer (DNBL) formed in the semiconductor substrate, the P-doped well formed between the top surface and the DNBL; and
   an N-doped well extending from the top surface to the DNBL wherein the N-doped well does not contact the P-doped well.

2. The device of claim 1, further comprising:
   a deep P-type buried layer (DPBL) formed between the DNBL and the P-doped well.

3. The device of claim 1, wherein the anode of the diode is connected to the DNBL via the N-doped well.

4. The device of claim 1, wherein the N-doped region is a first N-doped region, and the N-doped well includes a second N-doped region.

5. The device of claim 1, further comprising:
   a buffer having an output, a first input, and a second input, wherein the first input is coupled to the cathode, and wherein the output and the second input are coupled to the anode.

6. The device of claim 1, wherein one or more trenches is configured to provide isolation for the P-doped well.

7. A device comprising:
   a semiconductor substrate having a top surface;
   an N-doped well formed in the semiconductor substrate and extending downwardly from the top surface;
   a cathode of a diode formed by an N-doped region in the N-doped well;
   an anode of the diode formed by a P-doped region in the N-doped well, the P-doped region spaced laterally away from the N-doped region;
   a deep P-type buried layer (DPBL) formed in the semiconductor substrate, the N-doped well formed between the top surface and the DPBL; and
   a P-doped well extending from the top surface to the DPBL wherein the P-doped well does not contact the cathode of the diode.

8. The device of claim 7, wherein the cathode of the diode is connected to the P-doped well.

9. The device of claim 7, comprising:
   a deep N-type buried layer (DNBL) between the DPBL and a P-type substrate.

10. The device of claim 9, wherein the N-doped well is a first N-doped well, and the device further comprises:

a second N-doped well, wherein the second N-doped well is adjacent to the DNBL.

11. The device of claim 10, wherein the N-doped region is a first N-doped region, and the second N-doped well includes a second N-doped region.

12. The device of claim 10, wherein the cathode of the diode is coupled to the second N-doped region.

13. The device of claim 7, further comprising:
a buffer having an output, a first input, and a second input, wherein the first input is coupled to the anode, and wherein the output and the second input are coupled to the cathode.

14. The device of claim 7, wherein one or more trenches provides isolation for the N-doped well.

15. A circuit formed in a semiconductor substrate having a top surface, the circuit comprising:
an operational amplifier having an amplifier output, a first amplifier input, and a second amplifier input;
a first diode including:
a first cathode formed by a first N-doped region at the top surface in a first P-doped well;
a first anode formed by a first P-doped region at the top surface in the first P-doped well, the first N-doped region spaced away from the first P-doped region;
a deep N-type buried layer (DNBL), the first P-doped well situated between the top surface and the DNBL; and
a first N-doped well extending from the top surface to the DNBL wherein the first N-doped well does not contact the first P-doped well;
a second diode including:
a second cathode formed by a second N-doped region at the top surface in a second N-doped well;
a second anode formed by a second P-doped region at the top surface in the second N-doped well;
a deep P-type buried layer (DPBL), the second N-doped well situated between the top surface and the DPBL; and
a second P-doped well extending from the top surface to the DPBL;
a buffer having a buffer output, a first buffer input, and a second buffer input, wherein the first buffer input is coupled to the first amplifier input, the first cathode, and the second anode; and
wherein the second buffer input and the buffer output are coupled to the first anode and the second cathode.

16. The circuit of claim 15, wherein the DNBL and the first N-doped well are configured to isolate the first P-doped well.

17. The circuit of claim 15, wherein the DPBL and the second P-doped well are configured to isolate the second N-doped well.

18. The circuit of claim 15, further comprising:
a third diode having a third cathode coupled to the second amplifier input and a third anode coupled to the buffer output; and
a fourth diode having a fourth anode coupled to the second amplifier input and a fourth cathode coupled to the buffer output.

* * * * *